United States Patent
Milkove et al.

(10) Patent No.: US 7,488,661 B2
(45) Date of Patent: Feb. 10, 2009

(54) DEVICE AND METHOD FOR IMPROVING INTERFACE ADHESION IN THIN FILM STRUCTURES

(75) Inventors: Keith Raymond Milkove, Beacon, NY (US); Michael Christopher Gaidis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 11/369,391

(22) Filed: Mar. 7, 2006

(65) Prior Publication Data

US 2007/0212795 A1  Sep. 13, 2007

(51) Int. Cl.
*H01L 21/336* (2006.01)
(52) U.S. Cl. .................... 438/303; 438/654; 438/725; 257/E23.127
(58) Field of Classification Search ................ 438/255, 438/398, 618–794, 303; 257/E23.127
See application file for complete search history.

(56) References Cited

U.S. PATENT DOCUMENTS

| 6,358,813 | B1 | 3/2002 | Holmes et al. | |
| 6,506,660 | B2 | 1/2003 | Holmes et al. | |
| 2002/0158342 | A1* | 10/2002 | Tuominen et al. | 257/784 |
| 2005/0079719 | A1* | 4/2005 | Colburn et al. | 438/694 |
| 2005/0277266 | A1* | 12/2005 | Cooney et al. | 438/455 |
| 2006/0086936 | A1* | 4/2006 | Hoffman et al. | 257/66 |

OTHER PUBLICATIONS

K.W. Guarini, et al., "Nanoscale Patterning using Self-assembled Polymers for Semiconductor Applications", American Vacuum Society, J.Vac. Sci. Technol. B 19(6) Nov./Dec. 2001; pp. 2784-2788.
C.T. Black, et al., "Integration of Self-assembled Diblock Copolymers for Semiconductor Capacitor Fabrication", American Institute of Physics, 2001, pp. 409-411.
C.T. Black, et al., "Formation of Nanometer-scale Dot Arrays from Diblock Copolymer Templates", Mat. Res. Soc. Symp. Proc. vol. 728; 2002; pp. 79-86.
C. T. Black, et al., "High-Capacity, Self-Assembled Metal-Oxide-Semiconductor Decoupling Capacitors", IEEE Electron Device Letters, vol. 24, No. 9, Sep. 2004; pp. 622-624.
C. T. Black, et al., "Nanometer-Scale Pattern Registration and Alignment by Directed Deblock Copolymer Self-Assembly", IEEE Transactions on Nanotechnology, vol. 3 No. 3, Sep. 2004; pp. 412-415.

* cited by examiner

*Primary Examiner*—H. Jey Tsai
(74) *Attorney, Agent, or Firm*—Keusey, Tutunjian & Bitetto, P.C.; Ido Tuchman

(57) ABSTRACT

A device and method for improving adhesion for thin film layers includes applying a diblock copolymer on a surface where adhesion to subsequent layers is needed and curing the diblock copolymer. Pores are formed in the diblock copolymer by treating the diblock copolymer with a solvent. The surface is etched through the pores of the diblock copolymer to form adhesion promoting features. The diblock copolymer is removed, and a layer is deposited on the surface wherein the adhesion promoting features are employed to promote adhesion between the layer and the surface.

13 Claims, 10 Drawing Sheets

DEVICE AND METHOD FOR IMPROVING INTERFACE ADHESION IN THIN FILM STRUCTURES

BACKGROUND

1. Technical Field

The present invention relates to improving adhesion between thin films, and more particularly to methods and devices made thereby which employ a self-organizing diblock copolymer film employed as an etch mask to transfer holes into an underlying layer.

2. Description of the Related Art

Interface adhesion of thin films used in state of the art integrated circuit processing is often inadequate, especially when subjected to chemical-mechanical planarization (CMP). The existence of weak interfacial coupling in multi-layer thin film stacks can lead to shear failure as a result of CMP, large temperature excursions, and the addition of tensile or compressive film layers to the stack. This problem can limit the yield and reliability of modern integrated circuits. In extreme cases, the lack of adhesion can produce catastrophic delamination, which not only damages the on-wafer circuitry, but may also contaminate/damage tooling. These problems are most acute when the poorly adhering materials possess relatively smooth interfaces.

Referring to FIGS. 1A and 1B, an example MRAM (Magnetic Random Access Memory) structure 10 is illustratively shown in its undamaged state (FIG. 1A). The MRAM structure 10 includes a substrate 12 with a metal plate 14 formed thereon. An MRAM device 16 is topped with an integrated hard mask 17. A dielectric adhesion layer 18 is formed thereon followed by an interlevel dielectric layer 20. FIG. 1B shows delamination of the interlevel dielectric layer 20 and/or the adhesion layer 18 due to stressful conditions during processing or operation.

In some cases, the identification and inclusion of a thin dielectric adhesion promoting layer as indicated in FIGS. 1A and 1B can reduce the delamination problem, but further improvement is still desirable.

SUMMARY

Embodiments of the present invention employ a self-organizing diblock copolymer film employed as an etch mask to transfer a dense, controllable array of shallow holes into an underlying relatively smooth thin film. The filling of these holes by a subsequent film layer provides an enhancement of thin film adhesion at this interface by virtue of a mechanical interlocking toe-hold.

A device and method for improving adhesion for thin film layers includes depositing a diblock copolymer layer on a surface and forming pores in the diblock copolymer layer. The surface is etched through the pores of the layer to roughen the surface. The layer is removed and another layer is deposited on the surface with improved adhesion to the surface.

A device includes a first layer having adhesion promoting features formed by transferring a pore pattern from a diblock copolymer mask by etching. A second layer is formed on the first layer, and the second layer includes portions extending into the adhesion promoting features to enhance adhesion to the first layer.

A device and method for improving adhesion for thin film layers includes applying a diblock copolymer on a surface where adhesion to subsequent layers is needed and curing the diblock copolymer. Pores are formed in the diblock copolymer by treating the diblock copolymer with a solvent. The surface is etched through the pores of the diblock copolymer to form adhesion promoting features. The diblock copolymer is removed, and a layer is deposited on the surface wherein the adhesion promoting features are employed to promote adhesion between the layer and the surface.

The adhesion promoting features are synthetically formed to promote adhesion and may be applied to any type layer to enhance adhesion between layers. The teachings set forth herein may be applied to any semiconductor technologies, including, e.g., Pt-based stack capacitors, FeRAM, and low-K dielectric films, etc.

The embodiments described herein are applicable at interfaces involving noble metals, spin-on layers, and situations requiring low temperatures that limit pervasive chemical bond formation.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1A:
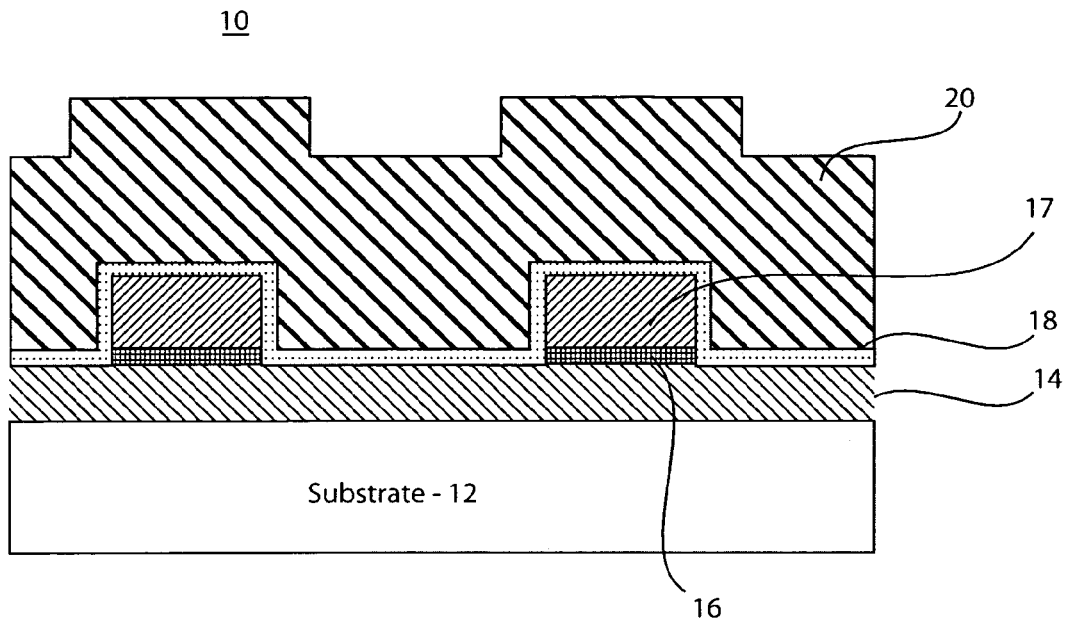
FIG. 1A is a cross-sectional view of an in-process magnetic random access memory device (MRAM) showing a dielectric adhesion layer between a dielectric layer and a metal layer in accordance with the prior art.
Figure 1B:
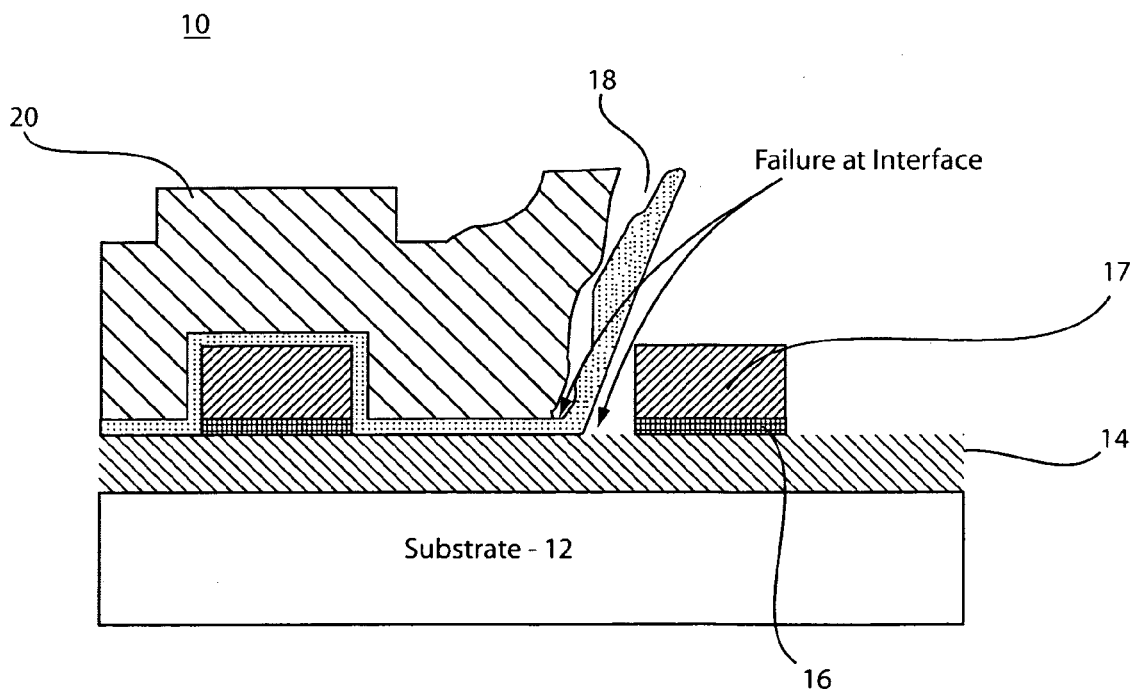
FIG. 1B is a cross-sectional view of the MRAM of FIG. 1A showing delamination at the interface between the metal and the dielectric layers in accordance with the prior art.

Embodiments of the present disclosure provide structures and fabrication methods for a multilayer film stack possessing much greater interfacial shear strength than conventional art. In useful embodiments, a surface is etched in accordance with a pore pattern to provide adhesion promoting features. In one embodiment, a processing sequence is introduced which generates a dense, controllable, uniform-depth 2-dimensional array of shallow, sub-lithographic dimension holes. These holes effectively create a roughening of the film surface, and provide an adhesion enhancing toe-hold through the mechanical interlocking of the roughened layer with any subsequently formed adjacent layer.

The topography generated is formed in a reliable, maskless, reproducible fashion utilizing diblock copolymer technology with one or two etch steps. The present embodiments are suitable for extremely small and tight-packed structures, entirely compatible with existing Si technology processing capability, and do not need the complexity and expense of an extra photomask layer.

Advantages over the existing art practice of utilizing an adhesion promoting thin layer include increased shear strength provided by the mechanical interlocking of the adhesion layer to the adjacent film layers. The present embodiments may even obviate the need for an adhesion layer. The improvements in shear strength increase yield, and reduce catastrophic failure from delamination, with associated damage to both tooling and wafers from flaking.

Further advantages are offered to both fully integrated magnetic random access memory (MRAM) builds and two level short loop (2LSL) designs. Embodiments relevant to integrated builds and the 2LSL will be considered separately below. It should be understood that the embodiments described herein are applicable to any semiconductor technologies and may be useful in technologies, such as Pt-based stack capacitors, FeRAM, low-K dielectric films, and applicable at interfaces involving noble metals, spin-on layers, and situations requiring low temperatures that limit pervasive chemical bond formation.

The embodiments described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Integration embodiments will now be illustratively described. These embodiments show different applications to illustrate aspects of the present invention for an MRAM integration process. Processes may include a spin-on-glass self-planarizing film application, MT level (hereinafter MT, MT level or layer is the second metal level) interlevel dielectric layer (ILD) adhesion layer roughening, a combined MT ILD adhesion/MA level (hereinafter MA, the MA level or layer is the first metal layer) plate layers roughening, and encapsulating sidewalls—MA plate layer roughening.

Figure 2:
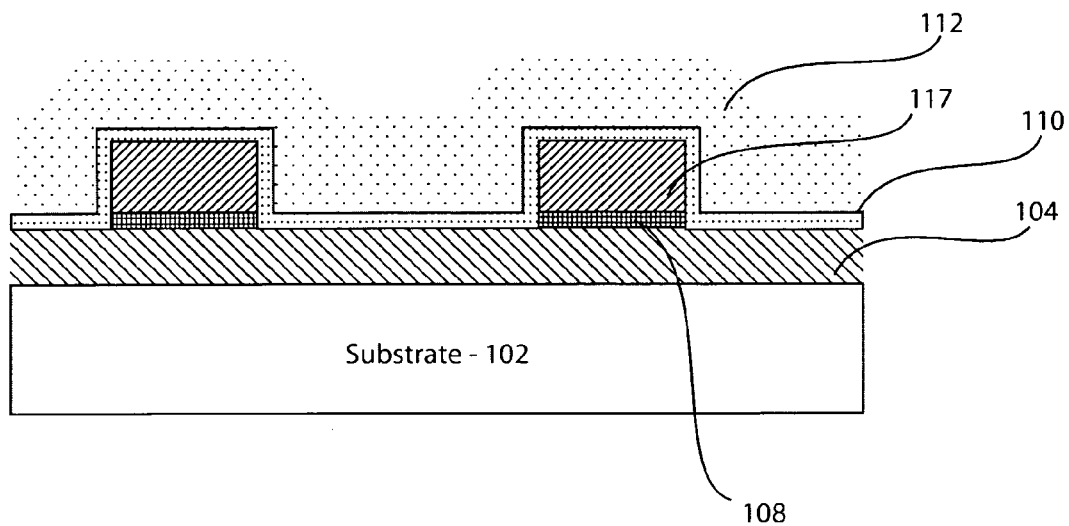
FIG. 2 is a cross-sectional view of an in-process magnetic random access memory device (MRAM) showing a dielectric adhesion layer having a dielectric layer formed thereon.

Referring now to the drawings in which like numerals represent the same or similar elements, FIG. 2 shows a monocrystalline substrate 102, e.g., a silicon substrate, and a metal or conductive plate 104 formed thereon for a device 100. Metal plate 104 may include platinum or other noble metal or alloys thereof. In one embodiment, the metal plate includes a PtMn top surface. Other materials may be employed having a ferromagnetic or antiferromagnetic material therein. Materials for magnetic tunnel junctions (MTJ) are deposited and delineated to form MTJ structures 108 topped with a hard mask 117, preferably employing dry etch, although other patterning processes may be used.

The MTJ structures 108 topped with a hard mask 117 are encapsulated with a thin adhesion promotion layer 110. In one example, the adhesion promotion layer is a 25 nm thick SiN layer. Adhesion layer 110 is optional, but preferred. An interlevel dielectric layer (ILD) 112 is deposited over the adhesion layer 110. ILD may include, e.g., a 300 nm TEOS layer. The 25 nm SiN adhesion and 300 nm TEOS layer thicknesses are merely illustrative thicknesses.

A single film, e.g., the ILD without an adhesion layer, may be employed, and/or variants in thicknesses may be used.

Figure 3:
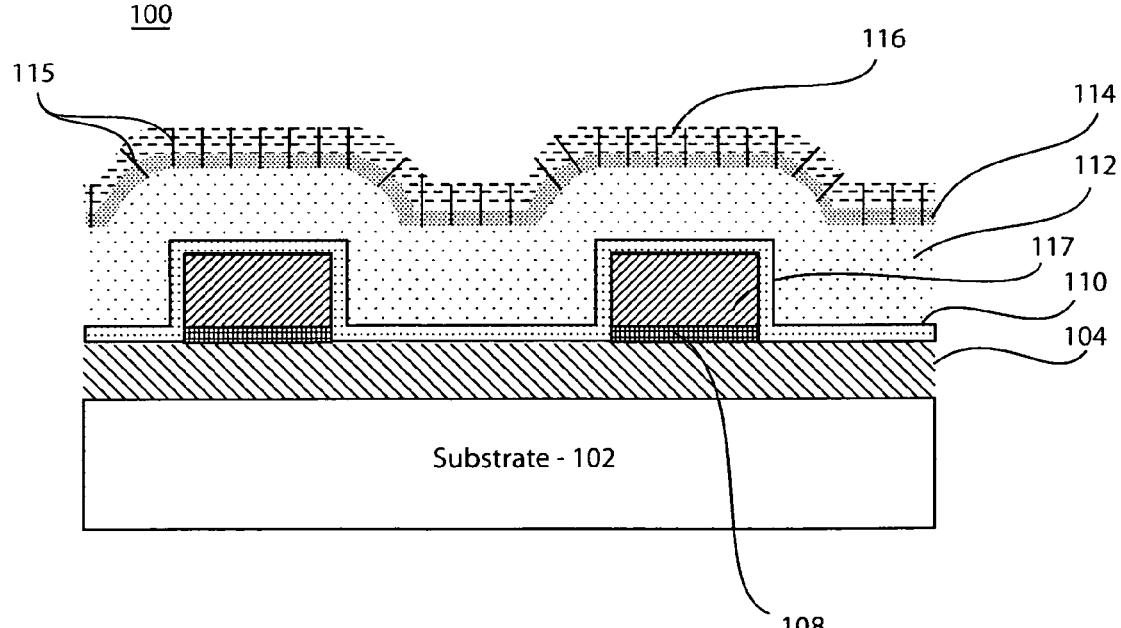
FIG. 3 is a cross-sectional view of the device of FIG. 2 having a diblock copolymer formed thereon and treated with a solvent, e.g., acetic acid, to form pores.

Referring to FIG. 3, a spincoat random copolymer layer 114 is formed on ILD 112 followed by a curing process. In one embodiment the random copolymer includes a mixture of polymethylmethacrylate (pmma) and polystyrene cured at 180 degrees C. for about one hour, or until layer 114 if fully cured.

One function of the random copolymer layer 114 is to render all exposed surfaces neutral to wetting by both constituents of a diblock copolymer mixture to follow. Under neutral wetting conditions, the pores that form in a diblock copolymer film (116) orient themselves normal to the surface. The random copolymer 114 is not unique in providing this property. Any material which renders the surface neutral to wetting by both diblock components would be suitable as a primer film.

The random copolymer layer 114 is followed by a diblock layer 116 having a densely packed 2-dimensional array of pores which will be formed therein by treating the layer with a solvent after curing the diblock layer 116 at about 180 degrees C. The random copolymer layer 114 and diblock copolymer layer 116 may be initially spun onto all features in a conformal manner. However, upon being cured, the random and diblock copolymer films 114 and 116 on the sides of features may migrate to either the top or bottom of the features, which may cause the films to become discontinuous. Any region where the diblock films remain, following the cure process, will possess pores that run perpendicular through the diblock copolymer film relative to the film surface. The films 114 and 116 will be shown as continuous throughout the drawings for simplicity.

In preferred embodiments, the random copolymer 114 may include a thin layer (e.g., about 3-7 nm of 58% by weight of polystyrene and 42% by weight of pmma). Layer 114 may be spun onto the surface in solution and cured for 15 minutes or more at between 160 to 250 degrees C.

In preferred embodiments, the diblock copolymer 116 may include a layer, which is about 25-35 nm in thickness and 70% by weight of polystyrene and 30% by weight of pmma. In illustrative embodiments, layer 116 may include a polystyrene/pmma ratio in the range of between 60%-75% for polystyrene and 40%-25% of pmma. Layer 116 may be spun onto the surface in solution and cured for 15 minutes or more at between 160 to 270 degrees C.

The diblock copolymer layer 116 includes, e.g., a polystyrene matrix with locations having pmma in them. Upon treating the layer 116 with solvent, the pmma is dissolved leaving pores in the polystyrene matrix. The phase separated pmma component in this particular diblock copolymer 116 may be dissolved using acetic acid. Other copolymers may be employed and other solvents may be used. The diblock layer 116 will now possess an array of densely packed pores 115 oriented normal to the film surface. In one embodiment, the pore diameter is approximately 20 nm with an approximate pitch between pores of about 40 nm, although other sized pores and pitches may be achieved and are effective.

In other embodiments, the random copolymer layer 114 may be eliminated. The quality of pores may be reduced, however since the random copolymer layer 114 assists in pore formation and alignment.

Figure 4:
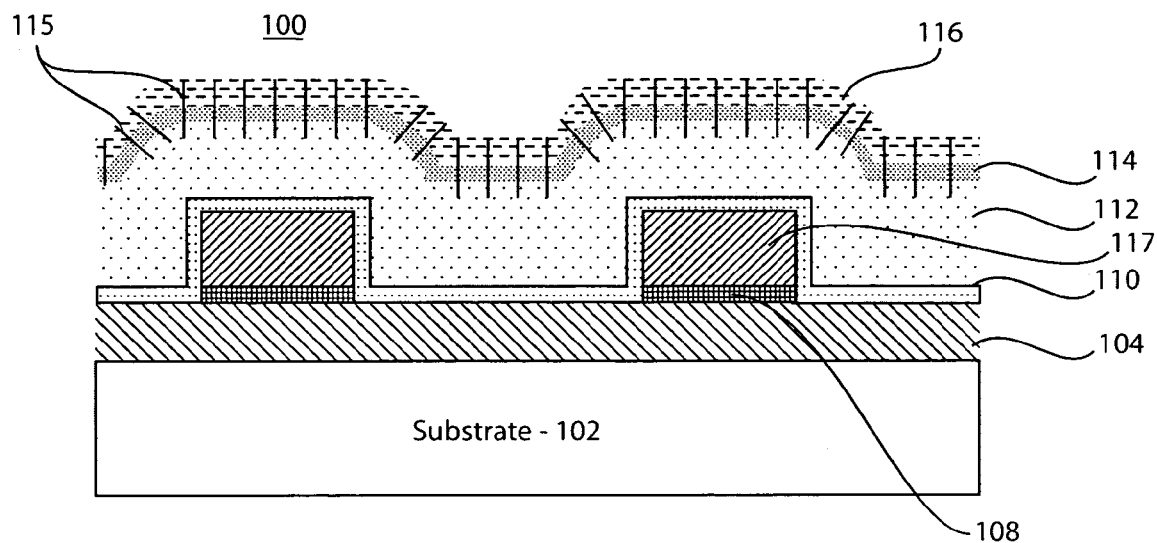
FIG. 4 is a cross-sectional view of the device of FIG. 3 with surface pores transferred from the diblock copolymer into the dielectric layer.

Referring to FIG. 4, an etch process is employed to pattern transfer the pore pattern 115 of the diblock layer 116 into the ILD layer 112 (e.g., a TEOS layer) utilizing a dry etch gas (or wet) chemistry appropriate for photoresist or e-beam masks. Etch depth may be approximately 20 nm, although other dimensions may be used and are effective. The diblock layer 116 and random copolymer layer 114 are stripped off the ILD layer 112 after the etch process.

Figure 5:
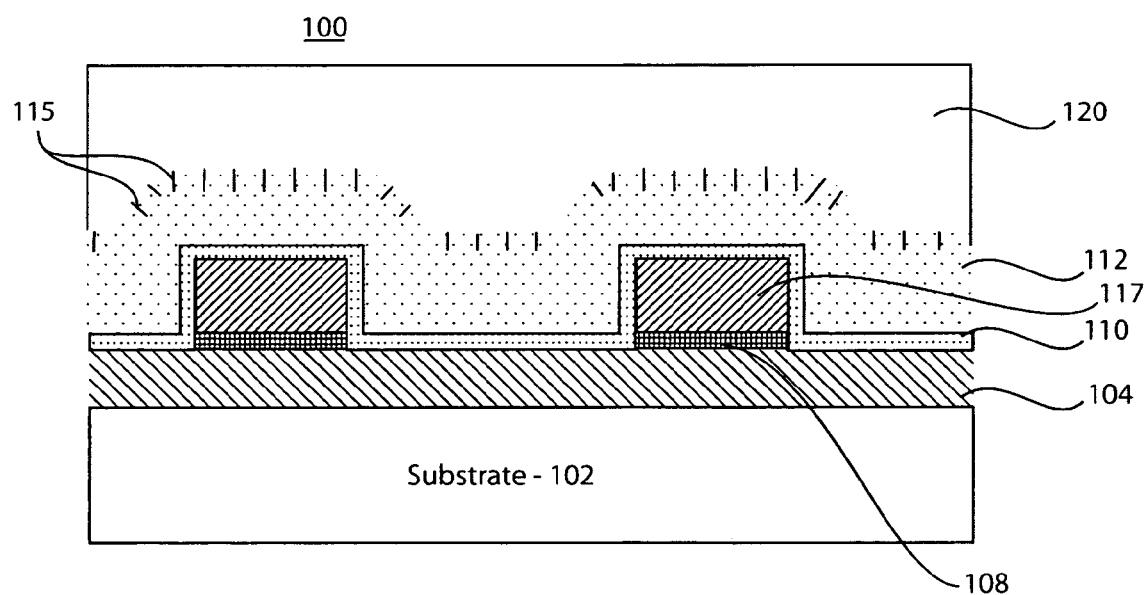
FIG. 5 is a cross-sectional view of the device of FIG. 4 having a spin on glass layer formed on the dielectric layer.

Referring to FIG. 5, a spin-on-glass (SOG) self-planarizing layer 120 is formed on the ILD layer 112. In one embodiment, the SOG layer 120 is approximately 3000 Angstroms thick. Other dimensions may be employed as well. The SOG layer 120 is cured. Advantageously, the pores 115 etched in the ILD layer 112 form adhesion promoting features and provide a way for mechanically interlocking the ILD layer 112 with the spin-on-glass layer 120. Adhesion promoting features may include shallow holes or pores formed in layer 112. After application and cure of the spin-on-glass 120, the wafer is ready for the MT level lithography and trench etching. As noted above, the interface created between the SOG 120 and the ILD 112 is a mere illustration of one useful embodiment. Other applications are also contemplated. Some examples follow.

Figure 6:
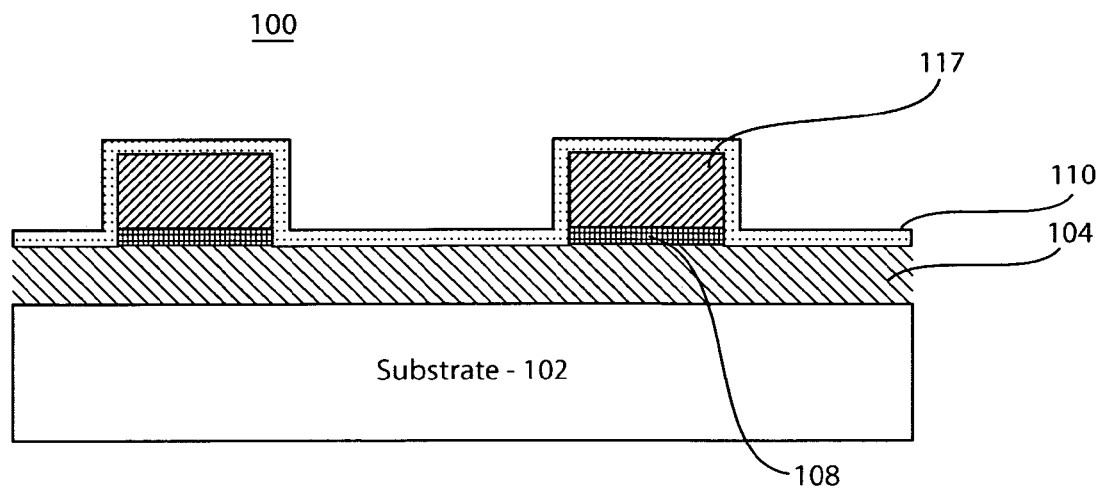
FIG. 6 is a cross-sectional view showing a device having an adhesion layer formed over MTJ structures.

Referring to FIG. 6, another integration embodiment shows roughening of an ILD adhesion layer. Substrate 102 includes metal plate 104 formed thereon. Metal plate 104 may include platinum or other noble metal or alloys thereof. In one embodiment, the metal plate includes a PtMn top surface. Other materials may be employed having a ferromagnetic or antiferromagnetic material therein. Materials for magnetic tunnel junctions (MTJ) are deposited and delineated to form MTJ structures 108 topped with hard masks 117, preferably employing a dry etch, although other patterning processes may be employed.

The MTJ structures 108 and hard masks 117 are encapsulated with a thin adhesion promotion layer 110. In one example, the adhesion promotion layer 110 is a 25 nm thick SiN layer.

Figure 7:
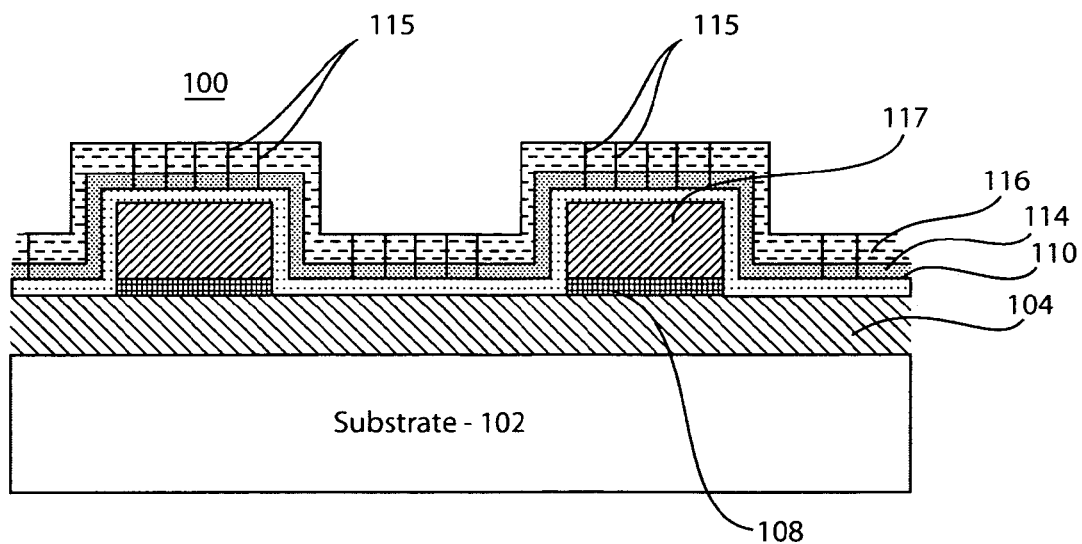
FIG. 7 is a cross-sectional view of the device of FIG. 6 having a diblock copolymer formed on the adhesion layer and treated with a solvent to form pores.

Referring to FIG. 7, a spincoat random copolymer layer 114 is formed on adhesion layer 110 followed by a curing process. In one embodiment the random copolymer 114 is cured. The random copolymer layer 114 is followed by a diblock layer 116 having a densely packed 2-dimensional array of pores 115 formed therein. The diblock layer 116 includes polystyrene and polymethymethacrylate material, and is cured as described above.

The pmma phase of the diblock copolymer 116 may be dissolved in acetic acid. The diblock layer 116 now possesses an array of densely packed pores oriented normal to the film surface. In one embodiment, the pore diameter is approximately 20 nm, although other sized pores may be achieved and are effective.

Figure 8:
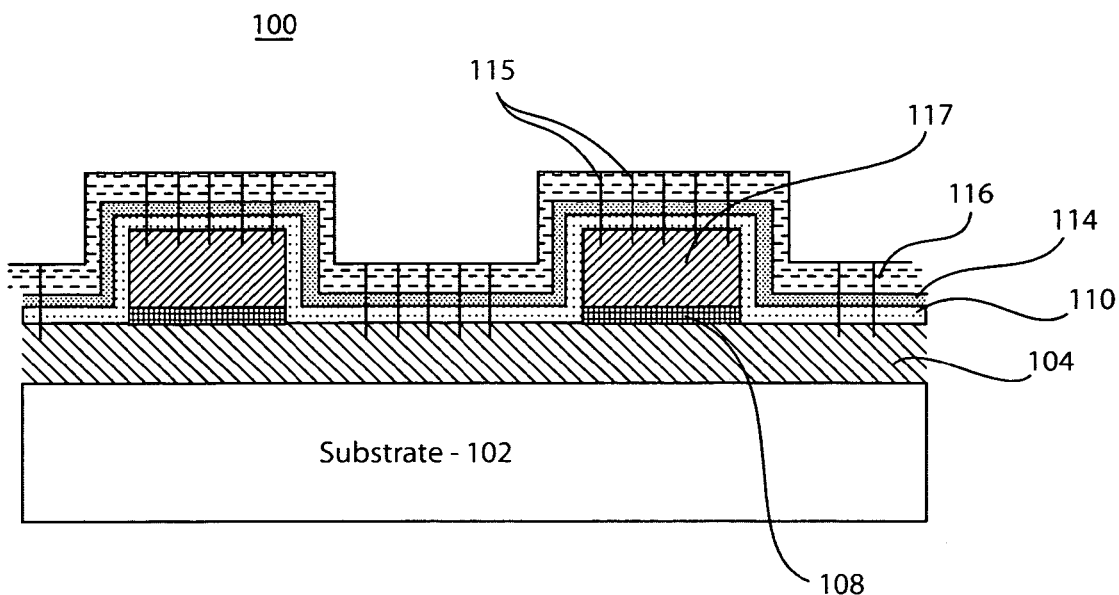
FIG. 8 is a cross-sectional view of the device of FIG. 7 showing the adhesion layer with a pattern of pores transferred into it from the diblock copolymer layer.

Referring to FIG. 8, an etch process is employed to pattern transfer the pore pattern 115 of the diblock layer 116 into the adhesion layer 110 (e.g., a SiN layer) utilizing a dry etch gas (or wet) chemistry appropriate for photoresist or e-beam masks. Etch depth may be approximately 20 nm, although other dimensions may be used and are effective. After the etch, the diblock layer 116 and random copolymer layer 114 are stripped off the adhesion layer 110.

An interlevel dielectric layer (ILD) 112 (FIG. 2) is deposited over the adhesion layer 110. ILD may include, e.g., a 300 nm TEOS layer. A spin-on-glass (SOG) self-planarizing layer 120 (FIG. 5) may be formed on the ILD layer 112, and a similar roughening process as described with reference to FIGS. 2-5 may be employed at each interface. Advantageously, the diblock formed pores provide a way of mechanically interlocking the ILD layer 112 with the adhesion layer 110 or between any two layers.

Figure 9:
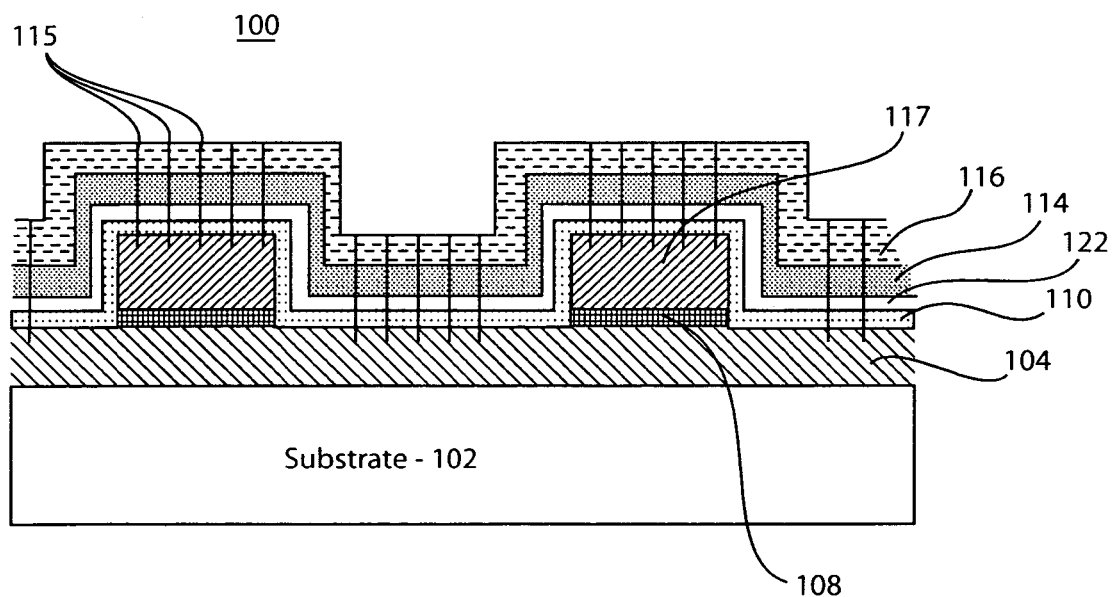
FIG. 9 is a cross-sectional view of the device of FIG. 7 showing the pore pattern in the diblock copolymer transferred to a hardmask layer, which in turn will be employed to transfer the pore pattern to or through the adhesion layer.

In an alternate embodiment, as shown in FIG. 9, if there is insufficient diblock thickness to produce the desired etch depth into the adhesion layer 110, a thin TEOS or LTO layer 122 can be deposited on top of the silicon nitride adhesion layer 110 prior to application of the random copolymer 114 and diblock copolymer layer 116. Pattern transfer can be made into the oxide layer 122 from the diblock copolymer layer 116, creating a hard mask. This step is followed by an additional pattern transfer from the hard mask 122 into the adhesion layer 110 using a highly selective dry etch, which in this embodiment would entail etching nitride selectively over oxide, but in general would depend on the material selection. Etching recipes exist, which possess selectivities in the range of 10-20 to 1 for etching nitride relative to oxide. Other materials and processes are also contemplated.

Layer 122 would be employed to transfer the etch pattern to adhesion layer 110 and/or hardmask 117 and metal layer 104. In other words, a hardmask dielectric layer 122 is formed prior to the diblock copolymer 116 and a pore pattern is transferred from the diblock copolymer 116 to the hardmask layer 122. The hardmask layer 122 is then employed (with the diblock copolymer layer 116 and random copolymer layer 114 or after the diblock copolymer layer 116 and random copolymer layer 114 have been removed) as an etch mask to etch the pore pattern into a layer 110 below the hardmask layer 122, using the hardmask layer 122 to transfer the pore pattern 115.

Figure 10:
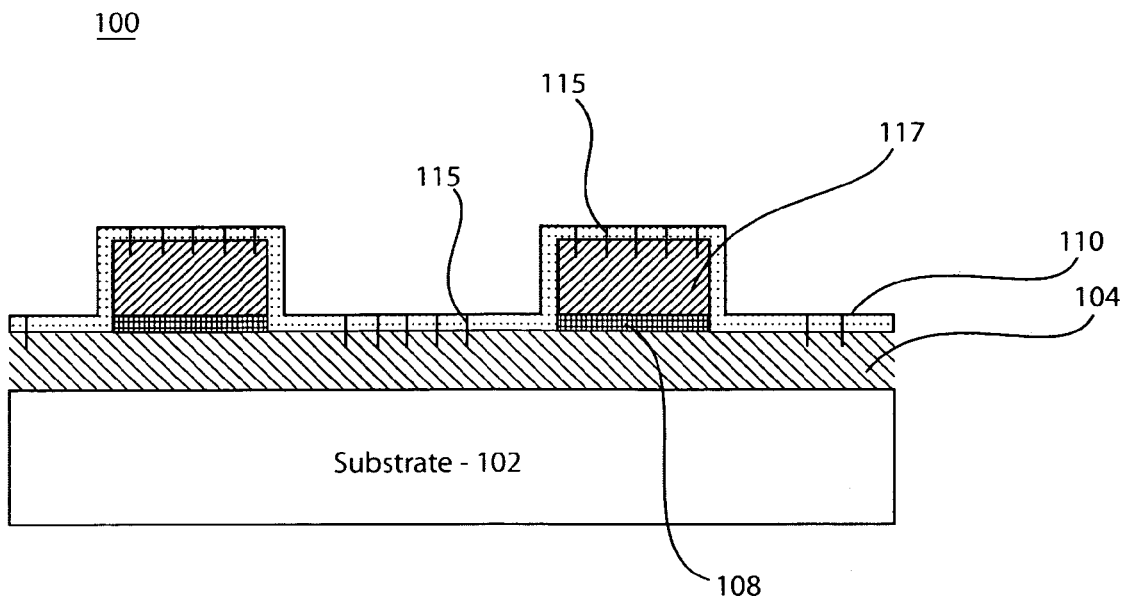
FIG. 10 is a cross-sectional view of the device of FIG. 8 or 9 showing the pore pattern transferred from the diblock copolymer passing through the adhesion layer into underlying layers.

Referring to FIG. 10, a pattern transfer is applied to the structure of FIG. 7 on both the adhesion layer 110 and to the plate 104 utilizing an etch process, which may include gas (or wet) chemistries appropriate for photoresist or e-beam masks. The pore pattern 115 is advantageously transferred to the adhesion layer 110, but also may extend into the plate 104 and portions of MTJ hard mask 117. The pore pattern 115 may be transferred using only diblock copolymer layer 116, random copolymer layer 114 or using diblock layer 116 and hardmask 122 (FIG. 9). The process flow may continue as usual from this point with the ILD deposition, etc.

Advantageously, the diblock pores provide for mechanical interlocking between, e.g., the ILD layer and the adhesion layer 110 and the plate 104. As shown in FIG. 9, an alternate embodiment exists, if there is insufficient diblock thickness to survive the full etch process. A thin TEOS or LTO layer 122 can be deposited on the SiN prior to application of the diblock layers. Pattern transfer can be made into the oxide layer, creating a hard mask, by using, e.g., a highly selective nitride to oxide etch. Etch recipes exist possessing selectivities in the range of 10-20 to 1 for nitride over oxide, as described above.

Figure 11:
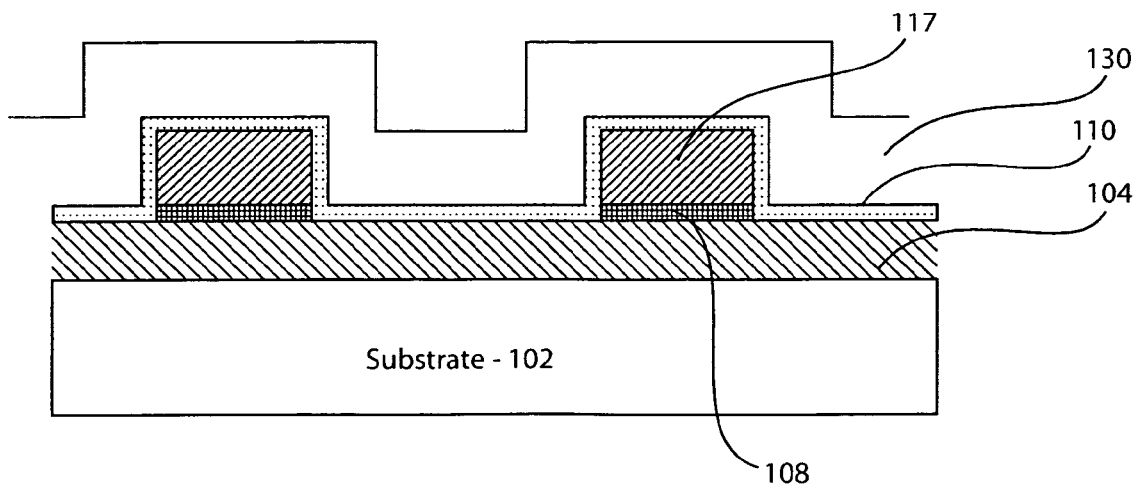
FIG. 11 is a cross-sectional view of a device after deposition of a dielectric layer that will be used to form spacers.

Referring to FIG. 11, the roughening process may include features which provide protection for device components and structures. As a result of the topography that exists at the edge of MTJ structure, a spacer may be added to isolate the periphery of the MTJ structure from the dense array of pores created by the random and diblock copolymers 114 and 116. The spacer will shield the periphery of the MTJ structure 108 during the pore etch/pattern transfer.

In one embodiment, a spacer layer 130 may be formed on an adhesion layer 110 (or directly on the MTJ structures 108, hard mask 117, and MA metal plate 104). Spacer layer 130 includes a dielectric material (e.g., SiN or an oxide) and is formed to encapsulate MTJ structures 108 or other structures, which may be sensitive to processing.

Figure 12:
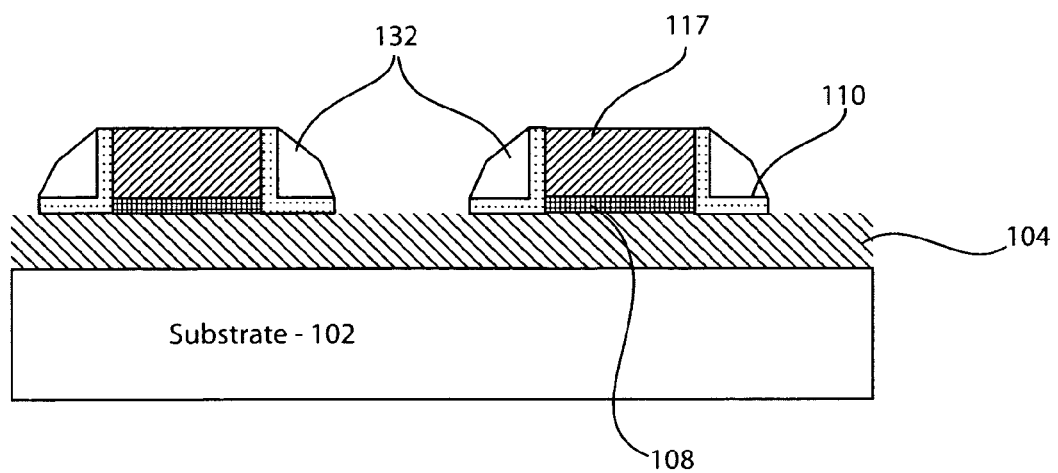
FIG. 12 is a cross-sectional view of the device of FIG. 11 showing the formation of spacers adjacent to MTJ structures.

Referring to FIG. 12, the thick dielectric spacer layer 130 is etched back to form spacers 132. Then, as shown in FIG. 13, a random copolymer 114 and a diblock copolymer layer 116 is applied, cured, and treated with acetic acid (or other solvent) to create a dense 2-dimensional array of pores 115.

Figure 13:
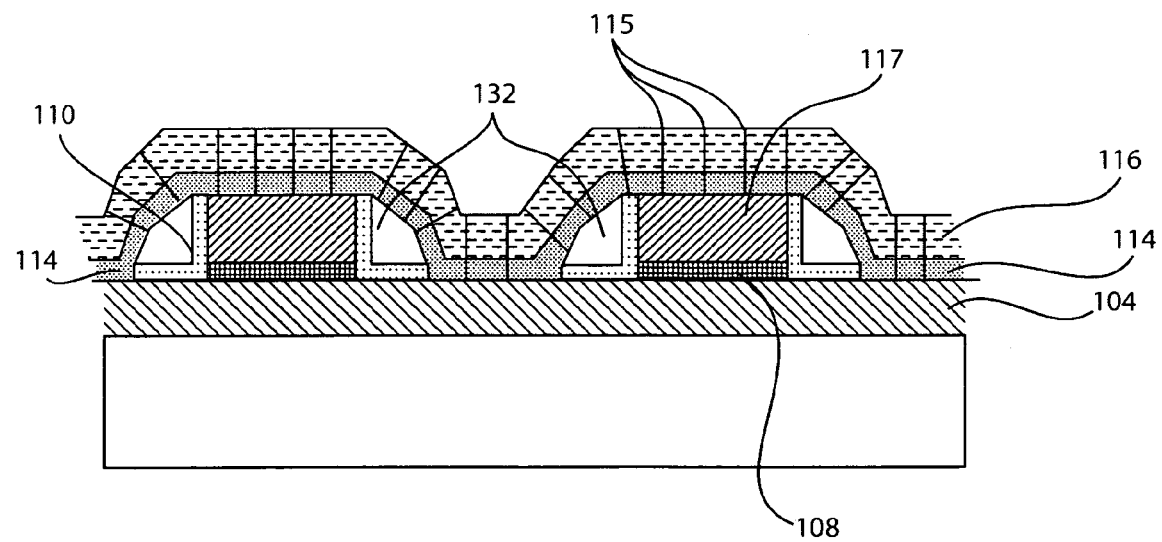
FIG. 13 is a cross-sectional view of the device of FIG. 12 showing a diblock copolymer formed over the structures and spacers.
Figure 14:
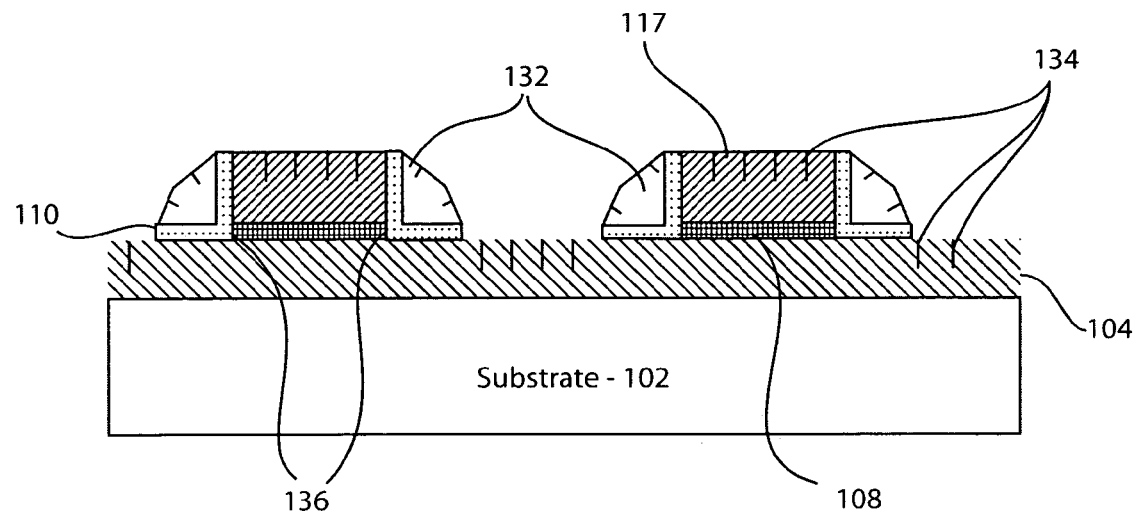
FIG. 14 is a cross-sectional view of the device of FIG. 13 after the pore pattern from the diblock copolymer has been transferred into the underlying layers.

Referring to FIG. 14, an etching process is employed to transfer the pores 115 of the pore pattern from the diblock copolymer layer 116 as shown in FIG. 13 into the MA metal plate 104, hard mask 117, and spacer 132 achieving a roughened surface (an additional hard mask may also be employed in FIG. 13, such as the hard mask 122 in FIG. 9). The etching process forms roughened or toe-hold regions. The spacers 132 provide more protection for device edges 136 by spacing pores 134 located in etched regions of the MA metal plate 104 farther from the sensitive MTJ regions of structures 108. After the pattern transfer etch, the diblock copolymer layer 116 and the random copolymer layer 114 are stripped away as shown in FIG. 14.

Figure 15:
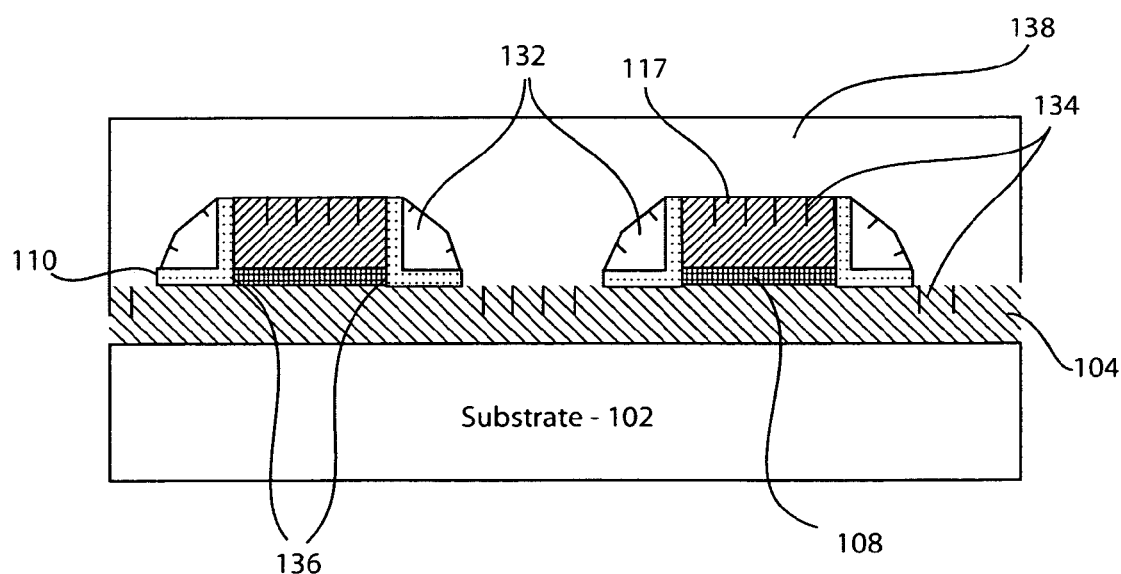
FIG. 15 is a cross-sectional view of the device of FIG. 14 showing a planarized dielectric layer formed over the transferred pore pattern.

In FIG. 15, a dielectric layer 138 may now be applied, with processing continuing as normal. Layer 138 may in part include a plasma enhanced chemical vapor deposition or a spin-on dielectric layer.

Substrate layer roughening may also be performed using the methods described herein. This may be performed with or without an adhesion layer on the substrate. One addition to this embodiment is the use of substrate roughening (with or without the intermediate CMP step to planarize the roughened deposited layer) for enhancing adhesion of spin-on dielectrics or low-K dielectrics on flat surfaces, MA metal plates, or polished metal (e.g., copper) damascene layers with N-BLoK caps. The N-BLoK cap layer can be textured with the diblock copolymer approach described herein, and the dielectrics deposited above will exhibit better adhesive strength). An illustrative method is described with reference to FIGS. 16-21.

Figure 16:
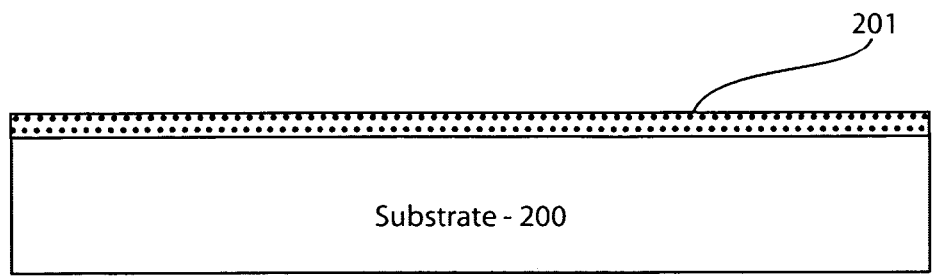
FIG. 16 is a cross-sectional view of a substrate.
Figure 17:
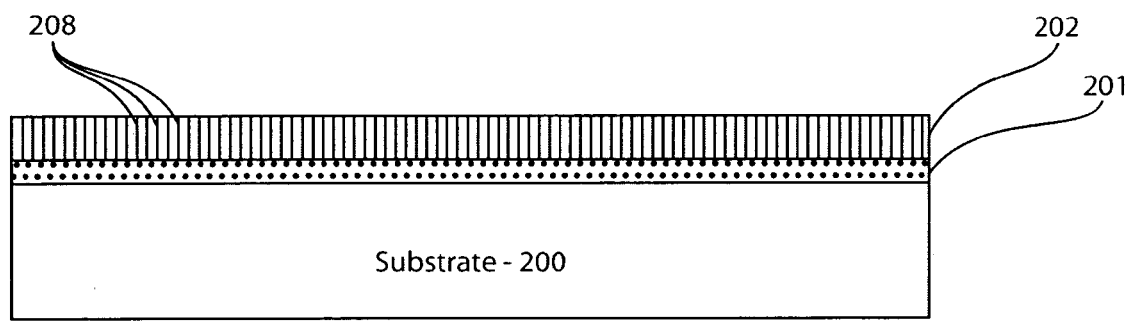
FIG. 17 is a cross-sectional view of the substrate of FIG. 16 showing the formation of a diblock copolymer layer on the substrate.
Figure 18:
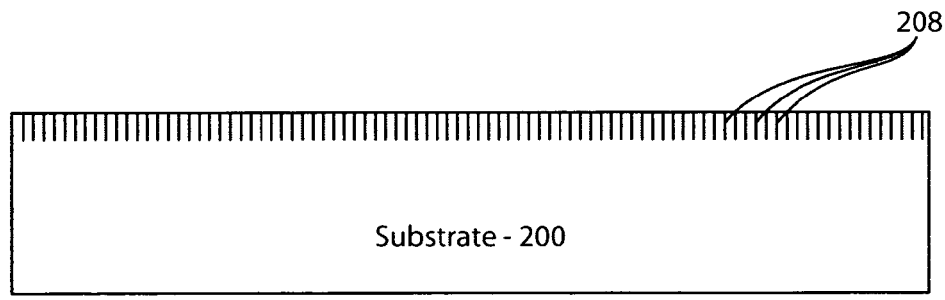
FIG. 18 is a cross-sectional view of the substrate of FIG. 17 after the pore pattern from the diblock copolymer is transferred into the surface of the underlying substrate, and the subsequent removal/consumption of the diblock copolymer layer.

Referring to FIG. 16, a substrate 200 includes a monocrystalline material, such as Silicon, GaAs, and Silicon-on-Insulator (SOI), or any other substrate material. The substrate 200 may be coated with a dielectric layer 201, such as $SiO_2$, LTO, or TEOS for example. Referring to FIG. 17, a diblock copolymer layer 202 is applied, cured and treated to create a 2-dimensional array of pores 208. A random copolymer layer may precede the diblock copolymer layer. Referring to FIG. 18, a pore pattern 208 is transferred into the substrate 200 by etching (wet or dry) through the diblock copolymer layer 202, after which the diblock copolymer layer 202 is removed. The random copolymer layer, if employed, and the dielectric layer 201 are also removed.

Figure 19:
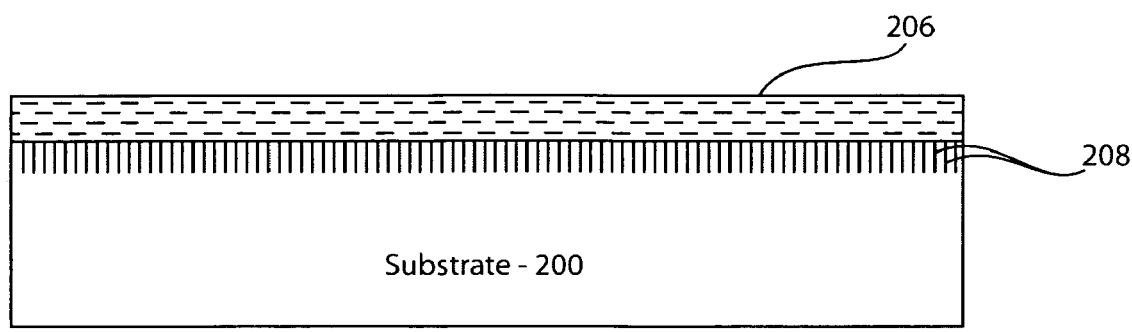
FIG. 19 is a cross-sectional view of the substrate of FIG. 18 showing an MA metal plate layer formed over the transferred pore pattern.
Figure 20:
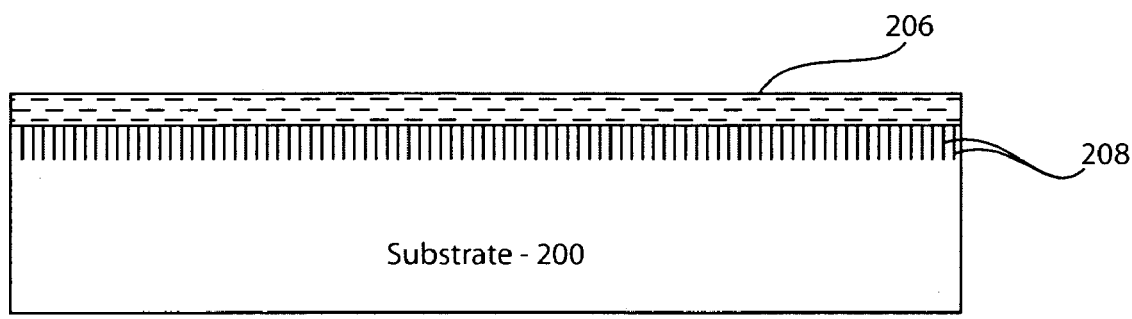
FIG. 20 is a cross-sectional view of the substrate of FIG. 19 showing the MA metal plate layer after CMP.

Referring to FIG. 19, a base metal, dielectric layer or other layer 206 is deposited over roughened areas as a result of pore pattern 208. In FIG. 20, an optional CMP process may be performed to partially polish or fully polish layer 206 (e.g., to reveal metal/dielectric filled pores at the substrate surface). In one embodiment, the polishing process is employed to provide an ultra-smooth MA metal plate base layer for MTJ stack deposition.

Figure 21:
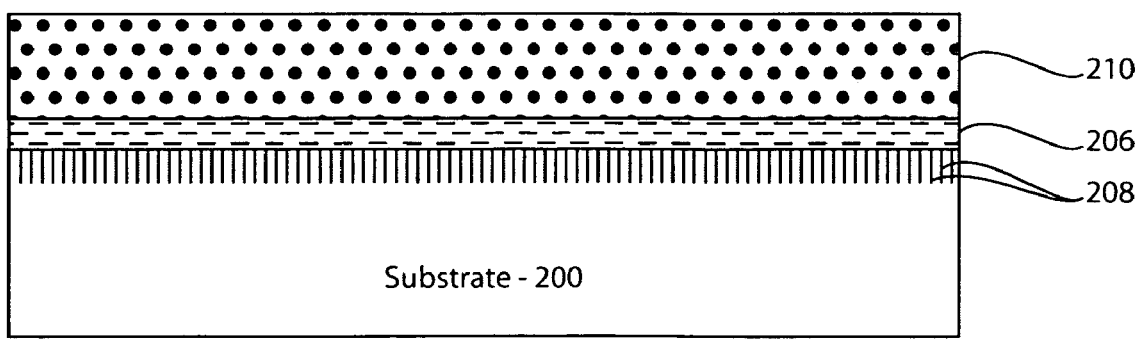
FIG. 21 is a cross-sectional view of the substrate of FIG. 20 showing an MTJ film stack formed on the MA metal plate layer.

Referring to FIG. 21, in one illustrative embodiment, an MTJ stack 210 is deposited on the ultra-smooth MA metal plate base layer 206. This configuration provides a mechanical locking toe-hold to the underlying substrate resulting in enhanced resistance of the MA metal plate to shear stress delamination. This embodiment offers a solution to the problem of large MA metal plate field regions which tend to delaminate when subjected to shear forces. By overcoming this problem, the short-loop process for MTJ structures will be much more robust. The short loop process refers to a fabrication process that eliminates all CMOS processing steps from the process flow, without seriously altering the functionality of the magnetic elements in an MRAM structure. The short loop build provides a test device or simulates fabrication of MRAM builds to permit testing and identification of problems in MRAM builds, while greatly reducing build time. The greatly reduced process time offered by short loops provides a dramatic reduction in the cycle time for developing new MRAM concepts, optimizing MRAM process techniques and structures, and debugging MRAM technical problems.

Having described preferred embodiments of a device and method for improving interface adhesion in thin film structures (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for improving adhesion for thin film layers, comprising:
   applying a diblock copolymer on a surface where adhesion to subsequent layers is needed and curing the diblock copolymer;
   wherein the surface includes structures formed thereon, forming spacers on the sides of the structures and forming the diblock copolymer on the spacers and structures;
   forming pores in the diblock copolymer by treating the diblock copolymer with a solvent;
   etching the surface through the pores of the diblock copolymer to form adhesion promoting features such that during etching the sides of the structures are protected by the spacers;
   removing the diblock copolymer; and
   depositing a layer on the surface wherein the adhesion promoting features are employed to promote adhesion between the layer and the surface.

2. The method as recited in claim 1, wherein the surface includes an adhesion layer and etching includes transferring a pattern formed by the pores into the adhesion layer.

3. The method as recited in claim 2, wherein the pattern is transferred through the adhesion layer to an underlying layer.

4. The method as recited in claim 1, wherein the surface includes a substrate and the layer is formed as one of a dielectric layer and a metal layer.

5. The method as recited in claim 1, wherein the surface includes structures formed thereon and the diblock copolymer is formed on the structures.

6. The method as recited in claim 1, wherein the structures form magnetic memory devices or portions thereof.

7. The method as recited in claim 1, further comprising depositing a hard mask dielectric layer prior to the diblock copolymer; transferring a pore pattern from the diblock copolymer to the hard mask layer and etching a layer below the hard mask layer using the hard mask layer to transfer the pore pattern.

8. The method as recited in claim 1, wherein the surface includes one of a dielectric layer and a metal plate.

9. The method as recited in claim 1, further comprising applying a random copolymer layer on the surface before the diblock copolymer.

10. A method for improving adhesion, comprising:
    applying a random copolymer layer on a surface, wherein the surface includes magnetic memory devices or portions thereof formed on the surface;
    applying a diblock copolymer layer on the random copolymer layer;
    forming spacers on the sides of the magnetic memory devices and forming the random and diblock copolymer layers on the spacers and magnetic memory devices such that during etching the sides of the magnetic memory devices are protected by the spacers;
    forming pores in the random and diblock copolymer layers by treating the layers with a solvent;
    etching the surface through the pores of the random and diblock copolymer layers to form adhesion promoting features on the surface;
    removing the random and diblock copolymer layers; and
    depositing a layer on the surface wherein the adhesion promoting features are employed to promote adhesion between the layer and the surface.

11. The method as recited in claim 10, wherein the surface includes an adhesion layer and etching includes transferring a pattern formed by the pores into the adhesion layer.

12. The method as recited in claim 10, further comprising depositing a hard mask dielectric layer prior to the random and diblock copolymer layers; transferring a pore pattern from the diblock copolymer layer to the hard mask layer and etching a layer below the hard mask layer using the hard mask layer to transfer the pore pattern.

13. The method as recited in claim 10, wherein the surface includes a metal plate.

* * * * *